(12) United States Patent
Eggers

(10) Patent No.: US 10,459,059 B2
(45) Date of Patent: Oct. 29, 2019

(54) PHASE CORRECTED DIXON MAGNETIC RESONANCE IMAGING

(71) Applicant: KONINKLIJKE PHILIPS N.V., Eindhoven (NL)

(72) Inventor: Holger Eggers, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 120 days.

(21) Appl. No.: 15/737,910

(22) PCT Filed: Jun. 15, 2016

(86) PCT No.: PCT/EP2016/063662
§ 371 (c)(1),
(2) Date: Dec. 19, 2017

(87) PCT Pub. No.: WO2016/207035
PCT Pub. Date: Dec. 29, 2016

(65) Prior Publication Data
US 2018/0299526 A1 Oct. 18, 2018

(30) Foreign Application Priority Data
Jun. 26, 2015 (EP) .................................. 15174033

(51) Int. Cl.
*G01R 33/565* (2006.01)
*G01R 33/58* (2006.01)
*G01R 33/48* (2006.01)

(52) U.S. Cl.
CPC ... *G01R 33/56518* (2013.01); *G01R 33/4828* (2013.01); *G01R 33/58* (2013.01)

(58) Field of Classification Search
None
See application file for complete search history.

(56) References Cited

U.S. PATENT DOCUMENTS 4,885,542 A 12/1989 Yao et al.
6,172,502 B1 1/2001 Groen
(Continued)

FOREIGN PATENT DOCUMENTS

| EP | 2392935 A1 | 12/2011 |
| WO | 2014162218 A1 | 10/2014 |
| WO | 2015036238 A1 | 3/2015 |

OTHER PUBLICATIONS

Bernstein et al "Handbook of MRI Pulse Sequences" 2004 p. 857-887.
(Continued)

*Primary Examiner* — Jermele M Hollington

(57) ABSTRACT

The invention provides for a Dixon method of controlling a magnetic resonance imaging (100) system. Acquiring (200) Dixon magnetic resonance data (142), first calibration magnetic resonance data (144), and second calibration magnetic resonance data (146) using pulse sequence commands (140). To cause the magnetic resonance imaging system to execute multiple pulse repetitions (310). The multiple pulse repetitions causes the magnetic resonance imaging system to generate a Dixon readout gradient (320) along a readout direction (402). The pulse sequence commands cause the processor to perform one or more first modified pulse repetitions (306) and one or more second modified pulse repetitions (308). The one or more first modified pulse repetitions causes the magnetic resonance imaging system to generate a first modified readout gradient (324) for acquiring first calibration magnetic resonance data (144) during the first modified readout gradient during at least one of the one or more first modified pulse repetitions. The first modified readout gradient is the Dixon readout gradient with an amplitude reduced by a predetermined factor (151). The one or more second modified pulse repetitions causes the magnetic resonance imaging system to generate a second modified readout gradient (328) for acquiring second calibration magnetic resonance data (146) during the second modified readout gradient during at least one of the one or more second modified pulse repetitions. The second modified readout gradient is the Dixon readout gradient with an amplitude reduced by the predetermined factor. The first modified readout gradient or the second modified readout gradient has a reversed polarity with respect to the Dixon readout gradient. First (148) and second (150) Fourier
(Continued)

transformed data (148) are calculated (202, 204) by Fourier transforming the first and second calibration magnetic resonance data in the readout direction, calculating (206) a phase difference (152) between the first and the second Fourier transformed data and a corrected phase difference (154) by interpolating and scaling the phase difference using the predefined factor, calculating (210) corrected Dixon magnetic resonance data (142) using the Dixon magnetic resonance data and the corrected phase difference, and calculating (212) a water signal (158) and a fat signal (160) from the corrected Dixon magnetic resonance data.

13 Claims, 6 Drawing Sheets

(56) References Cited

U.S. PATENT DOCUMENTS

| | | | | |
|---|---|---|---|---|
| 7,332,909 B2* | 2/2008 | Schaffter | ............ | G01R 33/565 324/307 |
| 9,523,749 B2* | 12/2016 | Eggers | ............ | G01R 33/4818 |
| 9,753,109 B2* | 9/2017 | Eggers | ............ | G01N 24/08 |
| 2008/0048659 A1 | 2/2008 | Reeder | | |
| 2013/0249554 A1 | 9/2013 | Simonetti et al. | | |
| 2016/0033606 A1* | 2/2016 | Eggers | ............ | G01R 33/4828 324/309 |
| 2016/0231405 A1 | 8/2016 | Eggers et al. | | |

OTHER PUBLICATIONS

Ma et al "Linear Phase-Error Correction for Improved Water and Fat Separation in Dual Echo Dixon Techniques" Magn. Reson Med 2008 p. 1250-1255.

Ahn et al, New Phase Correction Method in NMR Imaging Based on Autocorrelation and Histogram Analysis, IEEE Trans. Med Imaging, vol. MI-06, No. 1 Mar. 1, 1987 p. 32-36.

Ma "Breath Hold Water and Fat Imaging Using a Dual Echo Two-Point Dixon Technique" Magn. Res. Med 2004 p. 415-419.

Yu et al "Phase and Amplitude Correction for Multi-Echo Water-Fat Separation With Bipolar Acquisitions" Journal of Magn. Reson Imaging 2010 vol. 31, No. 5 p. 1264-1271.

Peterson et al "Fat Quantification Using Multiecho Sequences With Bipolar Gradients: Investigation of Accuracy and Noise Performance" Magnetic Resonance in Med. vol. 71, No. 1, Feb. 2013, p. 219-229.

Li et al "Phase Corrected Bipolar Gradients in Multi-Echo Gradient Echo Sequences . . . " Magnetic Resonance in Medicine, vol. 60, No. 5, Oct. 27, 2008, p. 1250-1255.

* cited by examiner

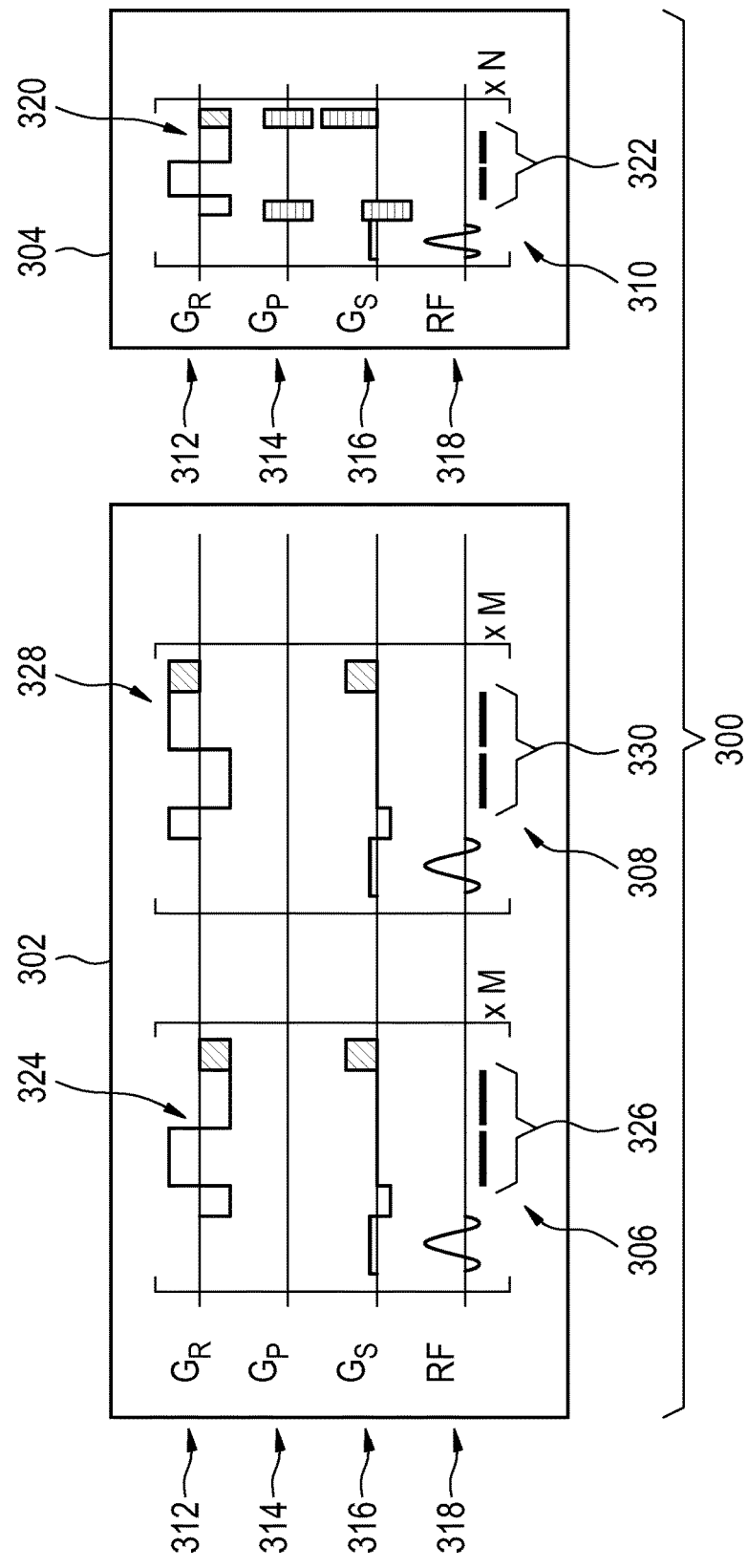

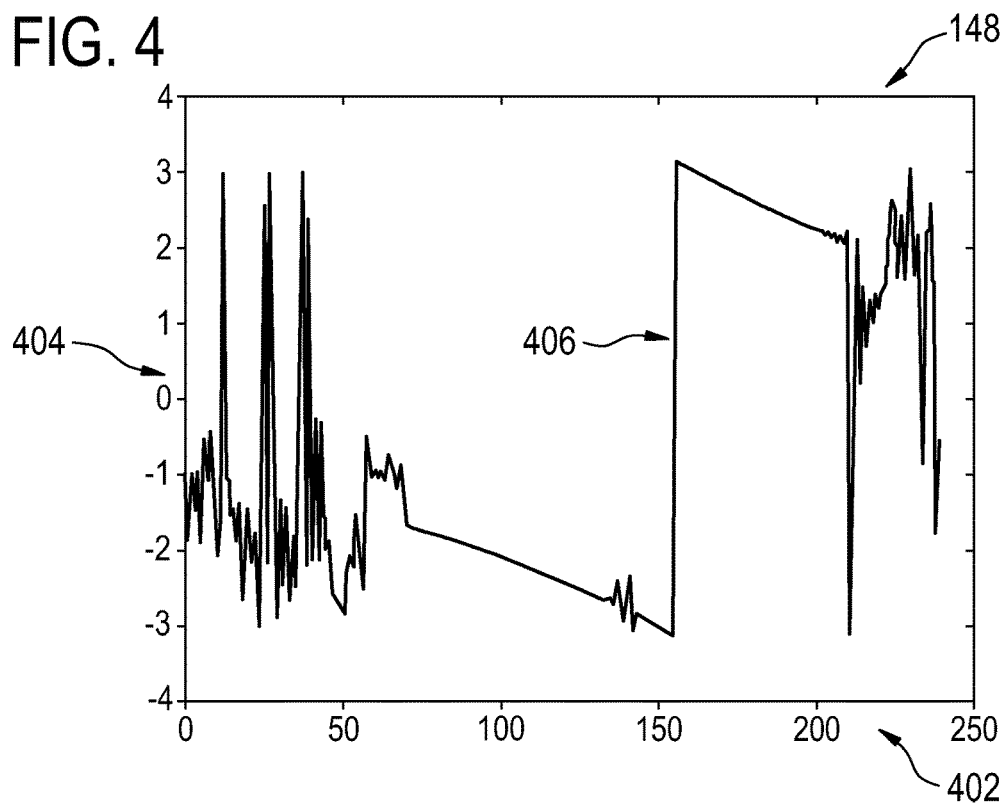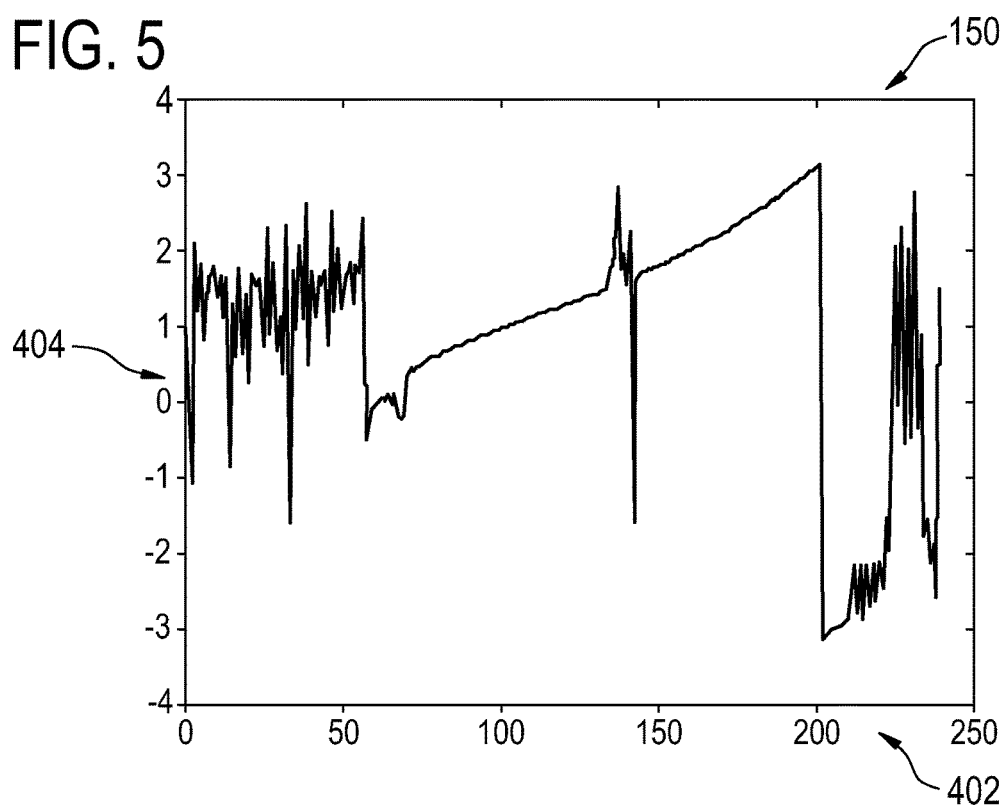

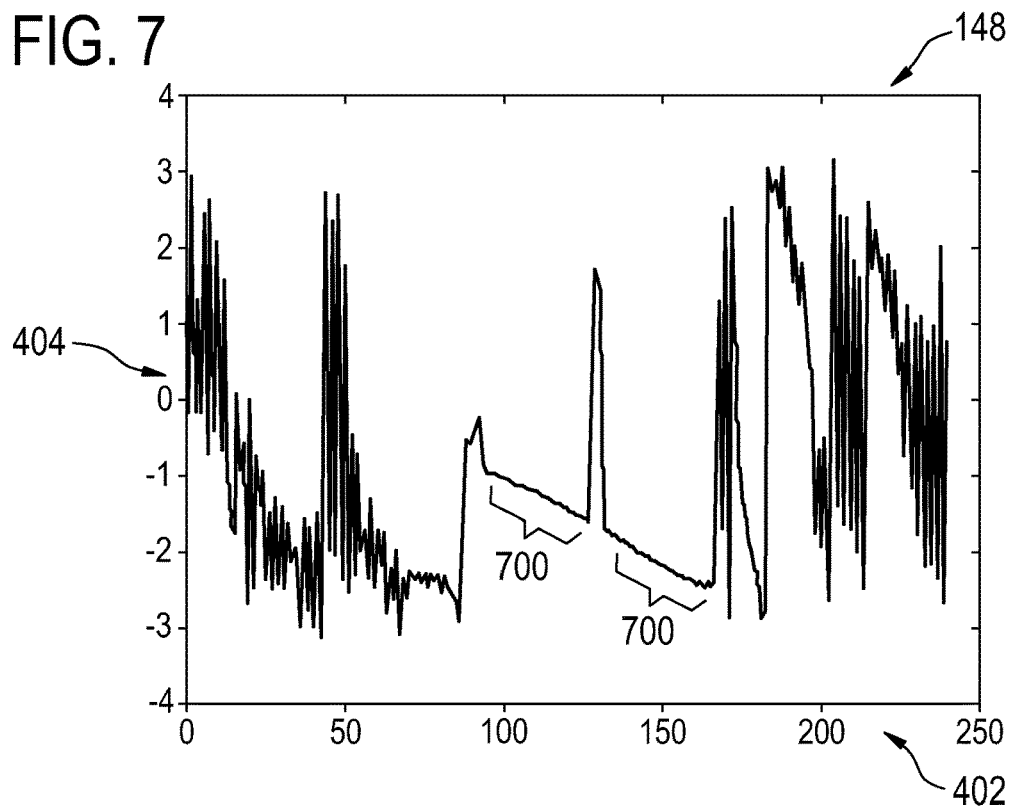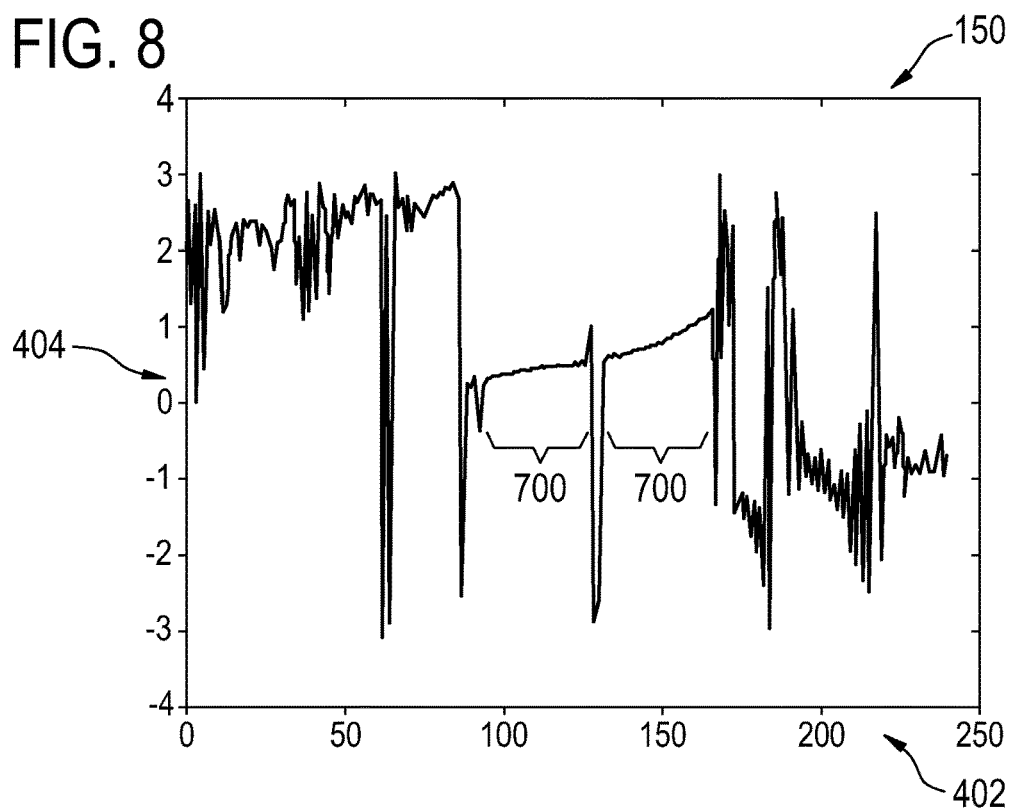

PHASE CORRECTED DIXON MAGNETIC RESONANCE IMAGING

CROSS REFERENCE TO RELATED APPLICATIONS

This application is a U.S. national phase application of International Application No. PCT/EP2016/063662, filed on Jun. 15, 2016, which claims the benefit of EP Application Serial No. 15174033.9 filed on Jun. 26, 2015 and is incorporated herein by reference.

TECHNICAL FIELD

The invention relates to magnetic resonance imaging, in particular the invention relates to Dixon methods and techniques of magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by one or more transmitter coils cause a called B1 field. Additionally applied gradient fields and the B1 field cause perturbations to the effective local magnetic field. RF signals are then emitted by the nuclear spins and detected by one or more receiver coils. These RF signals are used to construct the MR images. These coils can also be referred to as antennas. Further, the transmitter and receiver coils can also be integrated into one or more transceiver coils that perform both functions. It is understood that the use of the term transceiver coil also refers to systems where separate transmitter and receiver coils are used.

MRI scanners are able to construct images of either slices or volumes. A slice is a thin volume that is only one voxel thick. A voxel is a small volume element over which the MR signal is averaged, and represents the resolution of the MR image. A voxel may also be referred to as a pixel (picture element) herein if a single slice is considered.

Dixon methods of magnetic resonance imaging include a family of techniques for producing separate water and lipid (fat) images. The various Dixon techniques such as, but not limited to, two-point Dixon methods, three-point Dixon methods, and multi-point Dixon methods are collectively referred to herein as Dixon techniques or methods. The terminology to describe the Dixon techniques is well known and has been the subject of many review articles and is present in standard texts on Magnetic Resonance Imaging. For example, the "Handbook of MRI Pulse Sequences" by Bernstein et al., published by Elsevier Academic Press in 2004, contains a review of some Dixon techniques on pages 857 to 887.

The journal article Ma J et al., Magn Reson Med 2008; 60:1250-1255 discloses that large and spatially linear phase errors along the frequency encoding direction may be induced by several common and hard-to-avoid system imperfections such as eddy currents. Such linear phase errors can pose challenges to the phase correction algorithms commonly applied in Dixon processing. This article further discloses a two-step process that first corrects the linear component of the phase errors with a modified Ahn-Cho algorithm (Ahn C B et al., IEEE Trans Med Imaging 1986; 6:32-36) and then corrects the residual phase errors with a previously-developed region growing algorithm (Ma J, Magn Res Med 2004; 52:415-419).

U.S. Pat. No. 4,885,542 A discloses performing at least one extra NMR measurement cycle without imposing any magnetic gradients during readout and recordation of the NMR RF response. Calibration data derived from this extra measurement cycle or cycles can be used for resetting the RF transmitter frequency and/or for phase shifting other conventionally acquired NMR RF response data to compensate for spurious changes in magnetic fields experienced during the NMR data measuring processes.

The journal article Yu H et al., J Magn Reson Imaging 2010; 31:1264-1271 discloses that bipolar data may be subject to asymmetric amplitude modulations due to the receive filter response. This article further discloses correcting for these phase and amplitude errors by collecting a small number of phase-encoded lines with reversed gradient polarities.

SUMMARY OF THE INVENTION

The invention provides for a magnetic resonance imaging system, a method, and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical image data. A Magnetic Resonance (MR) image is defined herein as being the reconstructed two or three dimensional visualization of anatomic data contained within the magnetic resonance imaging data. This visualization can be performed using a computer.

In one aspect the invention provides for a magnetic resonance imaging system for acquiring Dixon magnetic resonance data from an imaging zone. Dixon magnetic resonance data is magnetic resonance data that has been acquired using a Dixon technique or protocol for magnetic resonance imaging.

The magnetic resonance imaging system comprises a processor for controlling the magnetic resonance imaging system. The magnetic resonance imaging system comprises a memory containing machine-executable instructions and pulse sequence commands for acquiring magnetic resonance data according to a Dixon magnetic resonance imaging method. The magnetic resonance data may comprise Dixon magnetic resonance data, first calibration magnetic resonance data, and second calibration magnetic resonance data.

The pulse sequence commands cause the magnetic resonance imaging system to execute multiple pulse repetitions. Each of the multiple pulse repetitions causes the magnetic resonance imaging system to generate a Dixon readout gradient along a readout direction. Each of the multiple pulse repetitions further causes the magnetic resonance imaging system to sample the Dixon magnetic resonance data during the readout gradient. The pulse sequence commands further cause the processor to perform one or more first modified pulse repetitions. The pulse sequence commands further cause the processor to perform one or more second modified pulse repetitions. The label first modified pulse repetitions and second modified pulse repetitions does not imply that the first modified pulse repetitions are performed before or after the second modified pulse repetitions.

Each of the one or more first modified pulse repetitions causes the magnetic resonance imaging system to generate a first modified readout gradient. The pulse sequence commands further cause the magnetic resonance imaging system to acquire first calibration magnetic resonance data during the first modified readout gradient during at least one of the one or more first modified pulse repetitions. The first modified readout gradient is the Dixon readout gradient with an amplitude reduced by a predetermined factor. Each of the one or more second modified pulse repetitions causes the magnetic resonance imaging system to generate a second modified readout gradient. The pulse sequence commands further cause the magnetic resonance imaging system to acquire second calibration magnetic resonance data during the second modified readout gradient during at least one of the one or more second modified pulse repetitions. The second modified readout gradient is the Dixon readout gradient with an amplitude reduced by the predetermined factor. The first or the second modified readout gradient has a reversed polarity with respect to the Dixon readout gradient and the other modified readout gradient.

The one or more first modified pulse repetitions and the one or more second modified pulse repetitions may be considered to be pre-pulses where measurements using a reduced gradient strength in the readout direction are acquired. In some instances the same predetermined factor may be used for each of these pre-pulses and in other examples the predetermined factor may be different for each of these pre-pulses. If the predetermined factor is the same for each of the multiple repetitions then this may have the advantage that eddy current-induced errors are more similar to those in the unmodified pulse repetitions. If the predetermined factor is varied between each of the pre-pulses it may have the advantage that calibration data is acquired for a variety of different gradient strengths and an optimum measurement can then be selected from the multiple measurements.

Execution of the instructions causes the processor to acquire the Dixon magnetic resonance data, the first calibration magnetic resonance data and the second calibration magnetic resonance data by controlling the magnetic resonance imaging system with the pulse sequence commands. The order in which the first calibration magnetic resonance data and the second calibration magnetic resonance data are acquired is not specified. In some cases the first calibration magnetic resonance data is acquired first and in others the second calibration magnetic resonance data is acquired first. Normally the first and second calibration magnetic resonance data are acquired before the Dixon magnetic resonance data. The first and second calibration magnetic resonance data are then used in the analysis of the Dixon magnetic resonance data. However, it is possible that the first and second calibration magnetic resonance data are acquired after the Dixon magnetic resonance data has already been acquired.

Execution of the machine-executable instructions further causes the processor to calculate the first Fourier transformed data by transforming the first calibration magnetic resonance data in the readout direction. Execution of the machine-executable instructions further causes the processor to calculate second Fourier transformed data by Fourier transforming the second calibration magnetic resonance data in the readout direction. Execution of the machine-executable instructions further causes the processor to calculate a phase difference between the first Fourier transformed data and the second Fourier transformed data. Execution of the machine-executable instructions further causes the processor to calculate a corrected phase difference by interpolating and scaling the phase difference using the predetermined factor. Calculating the corrected phase difference is not a matter of simple scaling because changing the strength of the readout gradient changes the region of interest. Therefore in some cases the data is also corrected for the change in the region of interest.

Execution of the machine-executable instructions further causes the processor to calculate a corrected Dixon magnetic resonance data using the Dixon magnetic resonance data and the corrected phase difference. Execution of the machine-executable instructions further causes the processor to calculate a water signal and a fat signal from the corrected Dixon magnetic resonance data.

In an optional step execution of the machine-executable instructions may further cause the processor to calculate a water image and a fat image from the water signal and the fat signal.

A readout gradient as used herein encompasses a gradient that is applied during magnetic resonance imaging that causes the spins in the imaging zone to re-phase and emit radio-frequency signals which are then measured. The measurement of these signals constitutes the measured magnetic resonance data.

In another embodiment the predetermined factor is 2. Setting the predetermined factor to 2 may have the advantage that reduction of the amplitude of the readout gradients by this factor essentially avoids the need to scale the phase difference during the calculation of the corrected phase difference. It may also have the advantage that phase unwrapping is not required before any such scaling.

In another embodiment the predetermined factor is between 1.8 and 2.2.

In another embodiment the predetermined factor is between 1.9 and 2.1.

In another embodiment execution of the machine-executable instructions further causes the processor to separately calculate constant components, linear components, and non-linear components of the phase of the first and the second Fourier transformed data. Execution of the machine-executable instructions further causes the processor to modify the sign of one or more of these constant, linear, and non-linear components such that these components have opposite signs for the first and the second Fourier transformed data acquired with opposite readout gradient polarity. This may have the effect of resolving phase wrapping. Execution of the machine-executable instructions further causes the processor to then calculate the (modified) phase difference between the first and the second Fourier transformed data.

In another embodiment the one or more first modified pulse repetitions are two or more first modified pulse repetitions. Each of the two or more first modified pulse repetitions has the first modified readout gradient reduced by a different predetermined factor chosen from a set of predetermined factors. The predetermined factor is a member of the set of predetermined factors. The one or more second modified pulse repetitions are two or more second modified pulse repetitions. Each of the two or more first modified pulse repetitions has the second modified readout gradient reduced by the different predetermined factor chosen from the set of predetermined factors. Execution of the machine-executable instructions further causes the processor to calculate a phase difference between the first and second Fourier transformed data for each of the set of predetermined factors.

Execution of the machine-executable instructions further causes the processor to find the smallest member of the set of predetermined factors that does not result in the detection of a potential phase wrapping in the phase difference. Execution of the machine executable instructions further causes the processor to calculate the corrected phase difference at least partially by resolving phase wrapping in the first Fourier transformed data and the second Fourier transformed data and/or in the phase difference, for each member of the set of predetermined factors that is smaller than the smallest member of the set of predetermined factors that does not result in the detection of a potential phase wrapping in the phase difference. For this purpose, the phase difference for the found smallest member of the set of predetermined factors that does not result in the detection of a potential phase wrapping in the phase difference can, for example, be scaled and interpolated and then be compared to the phase difference for the next smaller member to unwrap any phase wrapping in the phase difference for this next smaller member. This step can be repeated until the smallest member of the set of predetermined factors is reached. The phase difference for this smallest member of the set of predetermined factors is finally used to calculate the corrected phase difference.

A potential phase wrapping in the phase difference may for example be detected by examining the phase as a function of distance in the readout direction. The phase may vary between $\pi$ and $-\pi$. A discontinuity, such as an abrupt jump between $-\pi$ and $\pi$, would be one indication of a potential phase wrapping.

In this embodiment there is more than one pre-pulse each of the first modified pulse repetitions and the second modified pulse repetitions. Different predetermined factors may be used for each pre-pulse, where a higher predetermined factor corresponds to a lower amplitude of the readout gradient and thus to smaller phase (and amplitude) errors. The idea is to resolve ambiguous phase wrapping based on the smallest predetermined factor, i.e. the largest amplitude of the readout gradient, that does not result in phase wrapping. Once ambiguous phase wrapping is resolved, the corrected phase difference can be calculated based on the smallest predetermined factor with higher accuracy.

In another embodiment the one or more first modified pulse repetition is multiple first modified pulse repetitions or two or more first modified pulse repetitions. The multiple first modified pulse repetition comprises a last performed first modified pulse repetition. The first calibration magnetic resonance data is acquired during the last performed first modified pulse repetition.

In another embodiment the one or more second modified pulse repetition is multiple second modified pulse repetitions or two or more second modified pulse repetitions. The multiple second modified pulse repetitions comprise a last performed second modified pulse repetition wherein the second calibration magnetic resonance data is acquired during the last performed second modified pulse repetition.

Using the last performed second modified pulse repetition and/or the first modified pulse repetition may have the benefit that the magnetization being measured is more stable (in a steady state) than if an earlier repetition was used.

In another embodiment execution of the machine-executable instructions further causes the processor to detect a potential phase wrapping in the difference in phase between the first and the second Fourier transformed data. Execution of the machine-executable instructions further causes the processor to increase the predetermined factor if a potential phase wrapping is detected. This has the result of reducing the gradient strength and therefore reducing the chance that phase wrapping occurs. Execution of the machine-executable instructions further causes the processor to reacquire the first calibration magnetic resonance data and the second calibration magnetic resonance data by controlling the magnetic resonance imaging system with the pulse sequence commands after increasing the predetermined factor. This for example could be performed before acquiring the Dixon magnetic resonance data. For example the first and second Fourier transformed data could be calculated and then analyzed to see if there is a potential phase wrapping. If not, then the method may proceed and acquire the Dixon magnetic resonance data. If there is, then the first and second calibration magnetic resonance data could be reacquired using the corrected predetermined factor. This process could be performed repeatedly until no potential phase wrapping is detected anymore in the phase difference between the first and the second Fourier transformed data.

Execution of the machine-executable instructions further causes the processor to recalculate the first Fourier transformed data by Fourier transforming the first calibration magnetic resonance data in the readout direction after reacquiring the first calibration magnetic resonance data. Execution of the machine-executable instructions further causes the processor to recalculate the second Fourier transformed data by Fourier transforming the second calibration magnetic resonance data in the readout direction after reacquiring the second calibration magnetic resonance data. All these steps could be repeated until no potential phase wrapping is detected anymore in the difference in phase between the first and the second Fourier transformed data.

In another embodiment the readout gradient is a bipolar multi-echo readout gradient. In this embodiment the Dixon method may be a bipolar multi-echo Dixon imaging method.

In another embodiment the readout gradient is a bipolar dual-echo readout gradient. In this embodiment the Dixon method may be a bipolar dual-echo Dixon imaging method.

In another embodiment execution of the machine-executable instructions further causes the processor to determine a first amplitude of the first Fourier transformed data. Execution of the machine-executable instructions further causes the processor to determine a second amplitude of the second Fourier transformed data. Execution of the machine-executable instructions further causes the processor to calculate a ratio of a first effective coil sensitivity for readout gradients of a first polarity to a second effective coil sensitivity for readout gradients of a second polarity. The first polarity is opposite to the second polarity. The ratio is positive. The calculation of the corrected Dixon magnetic resonance data comprises interpolating and scaling this ratio using the predetermined factor and applying it to the amplitude of the corrected Dixon magnetic resonance data. In other words the ratio is used to correct or scale the amplitude of the corrected Dixon magnetic resonance data. When the magnetic resonance data is measured it is very likely that the measurements are taken asymmetrically with respect to the resonance of the radio-frequency coil and system. This may result in an effective coil sensitivity that is different for positive and negative gradients.

In one example the Dixon magnetic resonance data is corrected by multiplying one of the first or second Fourier transformed data by the square root of the ratio and then dividing the other of the first or second Fourier transformed data by the square root of the ratio. The selection of which is multiplied by the squire root of the ratio and which is divided by the square root of the ratio is chosen to correct for the amplitude difference.

The invention also relates to a computer program product for execution by a processor controlling a magnetic resonance imaging system for acquiring magnetic resonance data from an imaging zone, wherein execution of the instructions causes the processor to:

acquire Dixon magnetic resonance data, first calibration magnetic resonance data, and second calibration magnetic resonance data by controlling the magnetic resonance imaging system with pulse sequence commands, wherein the pulse sequence commands cause the magnetic resonance imaging system to acquire Dixon magnetic resonance data according to a Dixon magnetic resonance imaging method, wherein the pulse sequence commands cause the magnetic resonance imaging system to execute multiple pulse repetitions, wherein each of the multiple pulse repetitions causes the magnetic resonance imaging system to generate a Dixon readout gradient along a readout direction.

According to the invention, the pulse sequence commands further causes the processor to perform one or more first modified pulse repetitions. The pulse sequence commands further cause the processor to perform one or more second modified pulse repetitions. Each of the one or more first modified pulse repetitions causes the magnetic resonance imaging system to generate a first modified readout gradient. The pulse sequence commands further cause the magnetic resonance imaging system to acquire first calibration magnetic resonance data during the first modified readout gradient during at least one of the one or more first modified pulse repetitions. The first modified readout gradient is the Dixon readout gradient with an amplitude reduced by a predetermined factor. Each of the one or more second modified pulse repetitions causes the magnetic resonance imaging system to generate a second modified readout gradient.

The pulse sequence commands further cause the magnetic resonance imaging system to acquire second calibration magnetic resonance data during the second modified readout gradient during at least one of the one or more second modified pulse repetitions. The second modified readout gradient is the Dixon readout gradient with an amplitude reduced by the predetermined factor. The first or the second modified readout gradient has a reversed polarity with respect to the Dixon readout gradient and the other modified readout gradient. Execution of the machine-executable instructions further causes the processor to calculate first Fourier transformed data by Fourier transforming the first calibration magnetic resonance data in the readout direction. Execution of the machine-executable instructions further causes the processor to calculate second Fourier transformed data by Fourier transforming the second calibration magnetic resonance data in the readout direction. Execution of the machine-executable instructions further causes the processor to calculate a phase difference between the first and second Fourier transformed data.

Execution of the machine-executable instructions further causes the processor to calculate a corrected phase difference by interpolating and scaling the phase difference using the predetermined factor. Execution of the machine-executable instructions further causes the processor to calculate a corrected Dixon magnetic resonance data using the Dixon magnetic resonance data and the corrected phase difference. Execution of the machine-executable instructions further causes the processor to calculate a water signal and a fat signal from the corrected Dixon magnetic resonance data.

For example the readout gradient is a unipolar readout gradient or a flyback readout gradient.

In another aspect, the invention provides for a method of controlling a magnetic resonance imaging system to acquire magnetic resonance data from an imaging zone. The method comprises the step of acquiring Dixon magnetic resonance data, first calibration magnetic resonance data and second calibration magnetic resonance data by controlling the magnetic resonance imaging system with pulse sequence commands. The pulse sequence commands are commands which cause the magnetic resonance imaging system to acquire the magnetic resonance data according to a Dixon magnetic resonance imaging method. The pulse sequence commands cause the magnetic resonance imaging system to execute multiple pulse repetitions. Each of the multiple pulse repetitions causes the magnetic resonance imaging system to generate a Dixon readout gradient along a readout direction. Each of the multiple pulse repetitions further causes the magnetic resonance imaging system to sample the Dixon magnetic resonance data during the readout gradient. The pulse sequence commands further cause the processor to perform one or more first modified pulse repetitions.

The pulse sequence commands further cause the processor to perform one or more second modified pulse repetitions. Each of the one or more first modified pulse repetitions causes the magnetic resonance imaging system to generate first modified readout gradient. The pulse sequence commands further cause the magnetic resonance imaging system to acquire first calibration magnetic resonance data during the first modified readout gradient during at least one of the one or more first modified pulse repetitions. The first modified readout gradient is the Dixon readout gradient with an amplitude reduced by a predetermined factor. Each of the one or more second modified pulse repetitions causes the magnetic resonance imaging system to generate a second modified readout gradient. The pulse sequence commands further cause the magnetic resonance imaging system to acquire second calibration magnetic resonance data during the second modified readout gradient during at least one of the one or more second modified pulse repetitions. The second modified readout gradient is the Dixon readout gradient with an amplitude reduced by the predetermined factor. The first or the second modified readout gradient has reversed polarity with respect to the Dixon readout gradient and the other modified readout gradient. The method further comprises calculating first Fourier transformed data by Fourier transforming the first calibration magnetic resonance data in the readout direction. The method further comprises calculating second Fourier transformed data by Fourier transforming the second calibration magnetic resonance data in the readout direction.

The method further comprises calculating a phase difference between the first and the second Fourier transformed data. The method further comprises calculating a corrected phase difference by interpolating and scaling the phase difference using the predetermined factor. The method further comprises calculating a corrected Dixon magnetic resonance data using the Dixon magnetic resonance data and the corrected phase difference. The method further comprises calculating a water signal and a fat signal from the corrected Dixon magnetic resonance data.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which:

FIG. 3 illustrates an example of a pulse sequence timing diagram;

FIG. 4 illustrates an example of Fourier transformed magnetic resonance data;

FIG. 5 illustrates a further example of Fourier transformed magnetic resonance data;

FIG. 7 illustrates a further example of Fourier transformed magnetic resonance data; and FIG. 8 illustrates a further example of Fourier transformed magnetic resonance data.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
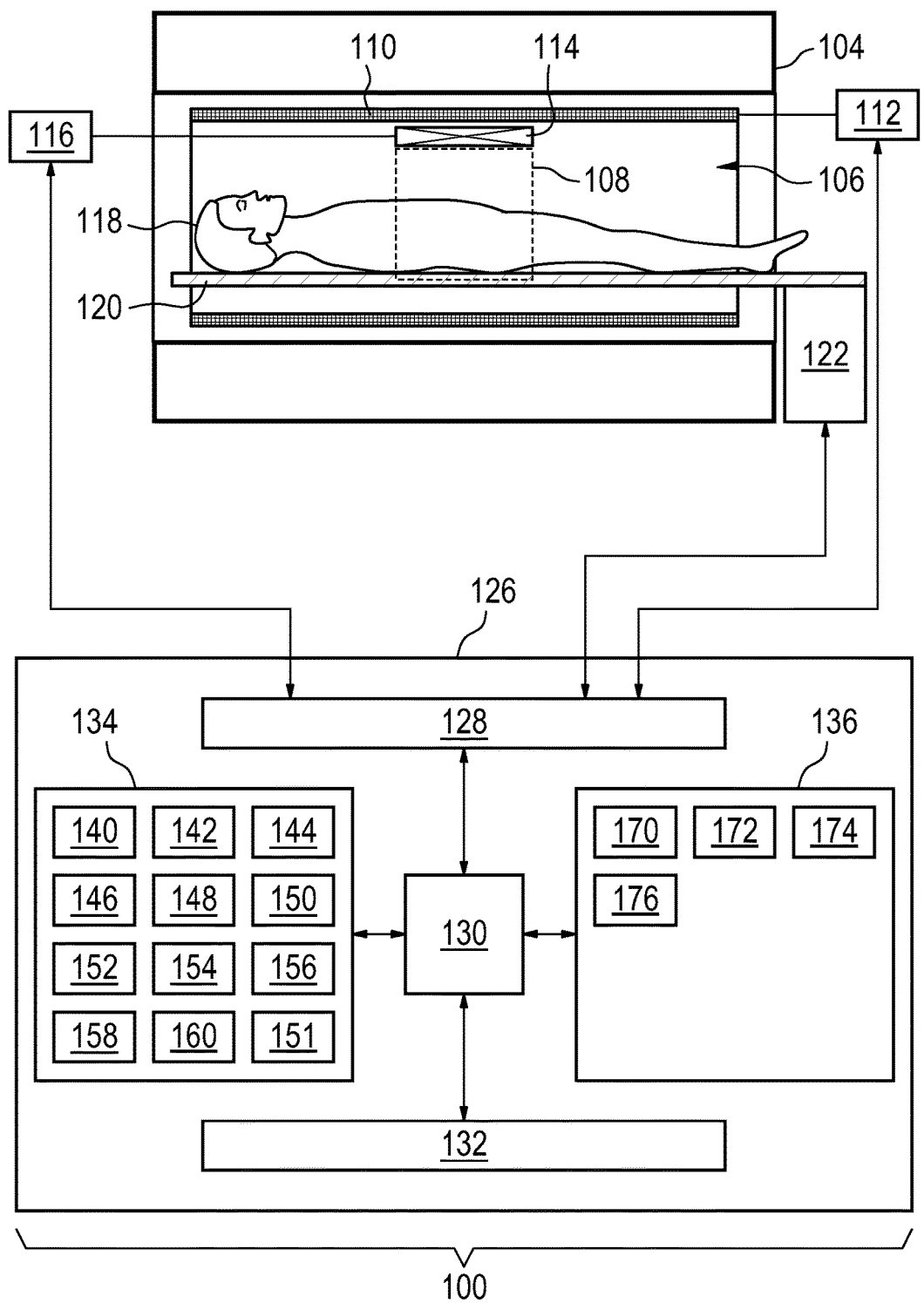
FIG. 1 illustrates an example of a magnetic resonance imaging system.

FIG. 1 shows an example of a magnetic resonance imaging system 100. The magnetic resonance imaging system 100 comprises a magnet 104. The magnet 104 is a superconducting cylindrical type magnet 104 with a bore 106 through it. The use of different types of magnets is also possible. Inside the cryostat of the cylindrical magnet, there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientation of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receiver. The radio-frequency coil 114 may also have multiple receive/transmit elements and the radio frequency transceiver 116 may have multiple receive/transmit channels.

Within the bore 106 of the magnet 104 there is a subject support 120 which is attached to an optional actuator 122 that is able to move the subject support and the subject 118 through the imaging zone 108. The transceiver 116, the magnetic field gradient coil power supply 112 and the actuator 122 are all seen as being connected to a hardware interface 128 of computer system 126.

The contents of the computer storage 134 and the computer memory 136 may be interchangeable. In some examples the contents of the computer storage 134 may be duplicated in the computer memory 136.

The computer storage 134 is shown as containing pulse sequence commands 140. The pulse sequence commands 140 either contain instructions or data which can be converted into instructions for controlling the magnetic resonance imaging system 100 to acquire Dixon magnetic resonance data 142, first calibration magnetic resonance data 144 and second calibration magnetic resonance data 146. This magnetic resonance data 142, 144, 146 is shown as being stored in the computer storage 134.

The pulse sequence commands 140 cause the magnetic resonance imaging system to acquire magnetic resonance data according to a Dixon magnetic resonance imaging method. The pulse sequence commands cause the magnetic resonance imaging system to execute multiple pulse repetitions, wherein each of the multiple pulse repetitions causes the magnetic resonance imaging system to generate a Dixon readout gradient along a readout direction. Each of the multiple pulse repetitions further causes the magnetic resonance imaging system to sample the Dixon magnetic resonance data during the readout gradient. The pulse sequence commands further cause the processor to perform one or more first modified pulse repetitions. The pulse sequence commands further cause the processor to perform one or more second modified pulse repetitions. Each of the one or more first modified pulse repetitions causes the magnetic resonance imaging system to generate a first modified readout gradient. The pulse sequence commands further cause the magnetic resonance imaging system to acquire first calibration magnetic resonance data during the first modified readout gradient during at least one of the one or more first modified pulse repetitions. The first modified readout gradient is the Dixon readout gradient with an amplitude reduced by a predetermined factor.

Each of the one or more second modified pulse repetitions causes the magnetic resonance imaging system to generate a second modified readout gradient. The pulse sequence commands further cause the magnetic resonance imaging system to acquire second calibration magnetic resonance data during the second modified readout gradient during at least one of the one or more second modified pulse repetitions. The second modified readout gradient is the Dixon readout gradient with an amplitude reduced by the predetermined factor. The first or the second modified readout gradient has a reversed polarity with respect to the Dixon readout gradient and the other modified readout gradient.

The computer storage 134 is shown as containing first Fourier transformed data 148 that were reconstructed from the first calibration magnetic resonance data 144. The computer storage 134 is further shown as containing second Fourier transformed data 150 that were reconstructed from the second calibration magnetic resonance data 146. The computer storage 134 is further shown as containing a phase difference 152 that was calculated using the first Fourier transformed data and the second Fourier transformed data. The computer storage 134 is further shown as containing a corrected phase difference 154 that was calculated from a phase difference 152 and a predetermined factor 151. The predetermined factor 151 is shown as being stored in the computer storage 134. The predetermined factor 151 may be a single value or it may be a set of values that can be used for different repetition pulses of the first calibration magnetic resonance data 144 or the second calibration magnetic resonance data 146. The computer storage 134 is further shown as containing corrected Dixon magnetic resonance data 156 that was corrected using the corrected phase difference 154. The computer storage 134 is further shown as containing a water signal 158 and a fat signal 160 that were calculated using the corrected Dixon magnetic resonance data 156.

The computer memory 136 is shown as containing a control module 170 that enables the processor 130 to control the operation and function of the magnetic resonance imaging system 100 and to perform basic analysis and calculations on various data. The computer storage 136 is further shown as containing an image reconstruction module 172 that enables the processor 130 to perform various mathematical and image processing techniques to calculate Fourier transformations and process magnetic resonance data into images or other signals. The computer memory 136 is further shown as containing a water image 174 and a fat image 176 that were calculated from either the corrected Dixon magnetic resonance data 156 or from the water signal 158 and the fat signal 160.

The contents of the computer storage 134 and 136 may either be duplicated or exchanged with each other. That is to say the contents of the computer storage 134 and the computer memory 136 are interchangeable and may also duplicate each other.

Figure 2:
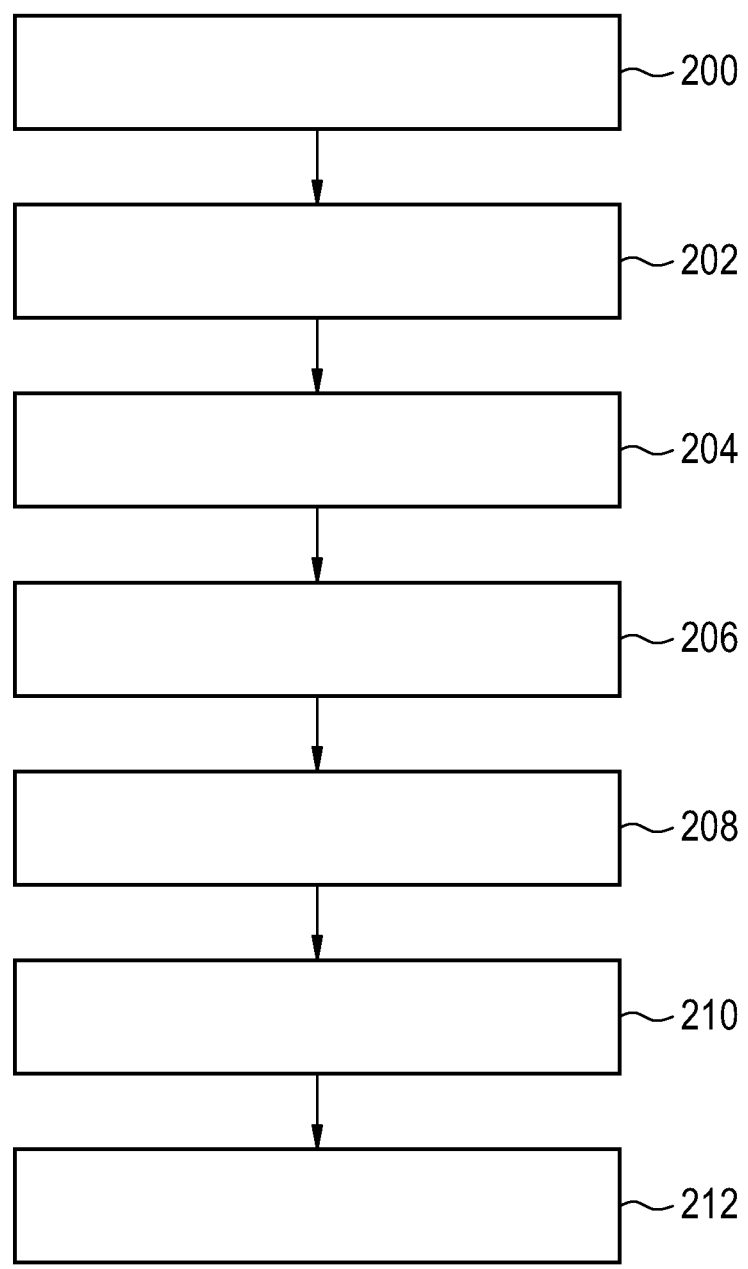
FIG. 2 shows a flow chart which illustrates a method of operating the magnetic resonance imaging system of FIG. 1.

FIG. 2 shows a flowchart which illustrates a method of controlling the magnetic resonance imaging system 100 of FIG. 1. First in step 200 the Dixon magnetic resonance data 142, the first calibration magnetic resonance data 144 and the second calibration magnetic resonance data 146 is acquired by controlling the magnetic resonance imaging system 100 with pulse sequence commands 140. Next in step 202 first Fourier transformed data 148 is calculated from the first calibration magnetic resonance data 144 by Fourier transforming the first calibration magnetic resonance data 144 in the readout direction. Next in step 204 the second Fourier transformed data 150 is calculated by Fourier transforming the second calibration magnetic resonance data 146 in the readout direction. Next in step 206 the phase difference 152 is calculated between the first Fourier transformed data 148 and the second Fourier transformed data 150. Next in step 208 the corrected phase difference 154 is calculated by interpolating and/or scaling the phase difference 152 using the predetermined factor 151. Next in step 208 the corrected Dixon magnetic resonance data 156 is calculated using the Dixon magnetic resonance data 142 and the corrected phase difference 154. Finally in step 212 a water signal 158 and a fat signal 160 are calculated from the corrected Dixon magnetic resonance data 156.

Eddy currents primarily affect the phase difference between the repeated measurements at different echo times performed in Dixon imaging and thus interfere with the water-fat separation. While it has previously been realized that a compensation of linear phase errors improves the robustness of the water-fat separation, constant phase errors have not specifically been addressed. However, constant phase errors carry the risk of introducing full swaps, i.e. a misallocation of fat signal to the water image and of water signal to the fat image.

Examples may provide a means of increasing the tolerance of the water-fat separation to constant phase errors. Examples may provide for strategies for estimating and compensating for constant phase errors based on a calibration measurement, in particular for bipolar dual-echo Dixon imaging. These strategies include using a lower strength of the readout gradient in the preparation phase, in combination with an interpolation and scaling of phase errors, and constraining the signs of the constant phase error for the odd and even echoes.

Dixon imaging involves chemical shift encoding by repeated measurements at different echo times. It relies on amplitude and phase differences between these measurements to separate water and fat.

Eddy currents primarily affect the phase difference between these measurements and thus interfere with the water-fat separation. They are particularly relevant in bipolar multi-echo acquisitions.

Previously, it has been realized that substantial linear phase errors, arising from so-called linear eddy currents, can cause the water-fat separation to fail, especially in the readout direction. Therefore, these linear phase errors should be removed prior to the water-fat separation.

The water-fat separation is to some extent immune to constant phase errors, stemming from so-called B0 eddy currents. However, these constant phase errors can introduce full swaps, i.e. a misallocation of fat signal to the water image and of water signal to the fat image, since they can be mistaken for an offset in resonance frequency due to the chemical shift of fat.

As mentioned above, examples may provide for a means of improving the tolerance of the water-fat separation to constant phase errors. It suggests strategies for estimating and compensating for constant phase errors based on a calibration measurement, in particular for bipolar dual-echo Dixon imaging. These strategies include using a lower strength of the readout gradient in the preparation phase, in combination with an interpolation and scaling of phase errors, and constraining the signs of the constant phase error for the odd and even echoes.

FIG. 3 shows a portion of a timing diagram 300 or pulse sequence. Not all elements of the pulse sequence are shown. The timing diagram 300 is shown as being divided into a preparatory phase 302 and an imaging phase 304. In the preparatory phase 302 a series of first modified pulse repetitions 306 are performed and then a series of second modified pulse repetitions 308 are performed. In the image phase 304 multiple pulse repetitions 310 are performed for acquiring the Dixon magnetic resonance data. The timing diagram 300 has labeled the readout gradient 312, the phase encoding gradient 314, the slice selection gradient 316 and the radio-frequency transmit and receive 318. The multiple pulse repetitions 310 are shown as comprising a Dixon readout gradient 320 that occurs for sampling event 322. During the sampling event 322 the Dixon magnetic resonance data is acquired. The first modified pulse repetition 306 is shown as having a first modified readout gradient 324 and a sampling event 326 when the first calibration magnetic resonance data 144 is acquired. The second modified pulse repetition 308 is shown as containing a second modified readout gradient 328 and a sampling event 330 when the second calibration magnetic resonance data 146 is acquired. In the example shown in FIG. 3 the gradients 324 and 328 are shown as having the same amplitude as the gradient 320. They have not been reduced by the predetermined factor. This is used to demonstrate the effect of reducing the strength of the gradients 324 and 328 in a later Fig.

Using the gradients 324 and 328 shown in FIG. 3, FIGS. 4 and 5 show the first Fourier transformed data 148 and the second Fourier transformed data 150. FIGS. 4 and 5 show the distance as the x-axis 402 in the readout direction and the phase 404 which is given in radians. FIG. 4 illustrates how use of the phase difference here may lead to phase wrapping or in the Dixon method to incorrectly labeling a region as fat or water. The vertical line labeled 406 is a discontinuity where the phase jumps from $-\pi$ to $+\pi$. If the phase difference is calculated from the data shown in FIGS. 4 and 5 the resulting Dixon images will have some of the water and fat regions swapped incorrectly. FIGS. 4 and 5 show a phase difference between the two readouts of echo 1 (FIG. 4) and echo 2 (FIG. 5) collected during the preparation phase with GR=20 mT/m and GR=−20 mT/m.

Figure 6:
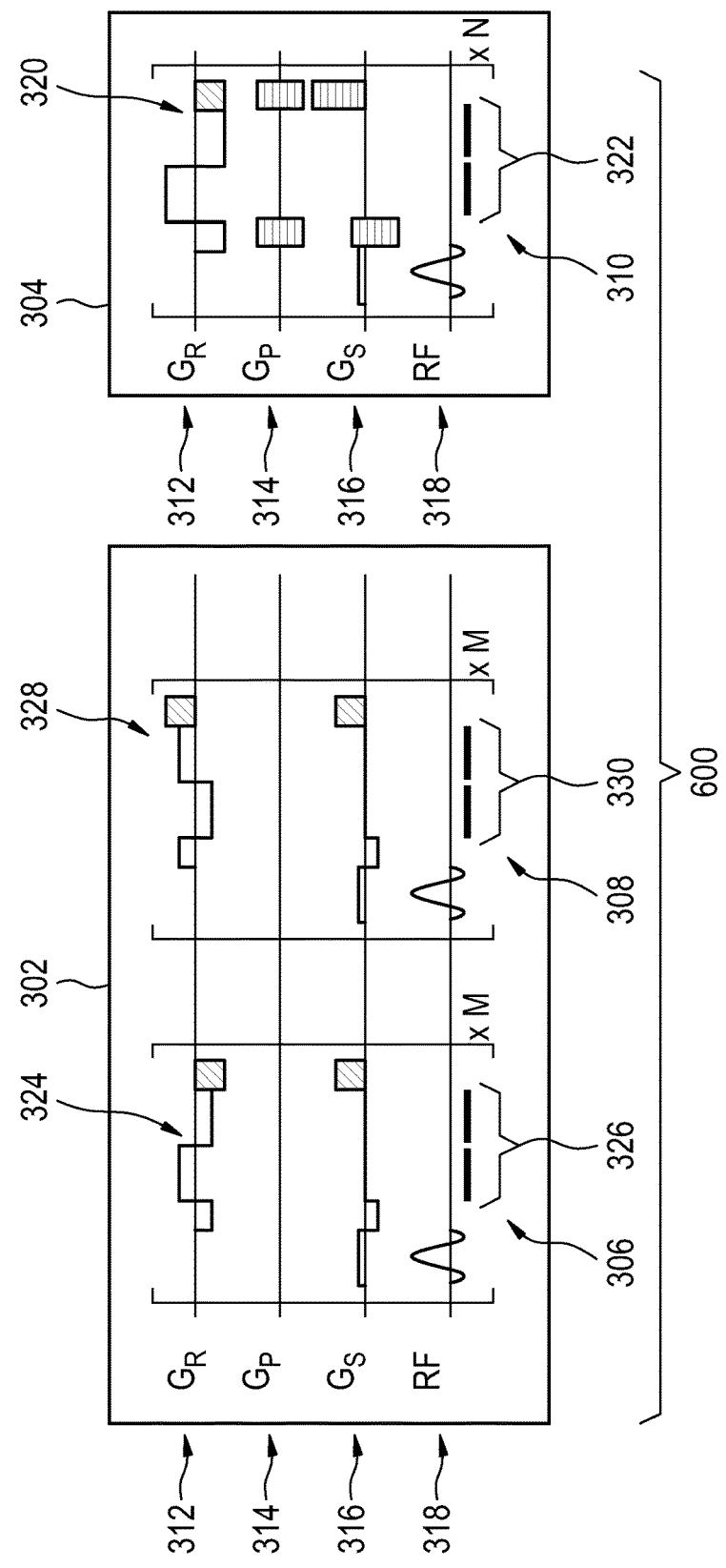
FIG. 6 illustrates a further example of a pulse sequence timing diagram.

FIG. 6 shows another example of a timing diagram 600 which illustrates portions of a pulse sequence. They may be used to generate the pulse sequence commands 140 shown in FIG. 1. In FIG. 6 the amplitude of the first modified readout gradient 324 and the second modified readout gradient 328 have been reduced by the predetermined factor 151. FIG. 6 shows a sequence or timing diagram of the modified preparation (left) and the imaging (right) phase of a bipolar dual-gradient-echo Dixon acquisition. Schematically shown are the readout gradient (GR), the phase encoding gradient (GP), the slice selection gradient (GS), and the radiofrequency (RF) transmit pulses and receive periods.

FIGS. 7 and 8 show the corresponding first Fourier transformed data 148 and the second Fourier transformed data 150. In the examples shown in FIGS. 7 and 8 there is no longer a discontinuity where the phase 404 jumps between + and $-\pi$. This means that the phase difference calculated from FIGS. 7 and 8 may be used to correctly calculate the phase difference. The areas labeled 700 in both diagrams indicate a linear or quasi-linear region where the phase difference can be calculated. FIGS. 7 and 8 show the phase difference between the two readouts of echo 1 (FIG. 7) and echo 2 (FIG. 8) collected during the modified preparation phase with GR=10 mT/m and GR=−10 mT/m.

The phase difference can be calculated in several different ways. For example, a linear fit can be made to region 700 in FIGS. 7 and 8 and then the linear fits can be compared. Additionally or alternatively, the phase difference at the center of the readout can be computed.

Before the imaging phase, two readouts of echo 1 and echo 2 are collected with opposite polarity of the readout gradient GR and without phase encoding gradient, as shown in FIG. 3. The phase difference between the two readouts is calculated, divided by two, and subtracted from the readouts subsequently gathered during the imaging phase. A representative phase difference is given in FIGS. 4 and 5. The phase error is obviously dominated by linear and constant components. The constant component gets close to $-\pi$ rad, or −180°, and thus may wrap, which likely causes a full swap in the water-fat separation.

To avoid this potential problem, a modified preparation phase is suggested, as shown in FIG. 6. It uses a lower strength of the readout gradient GR. A corresponding result to FIGS. 4 and 5 is provided in FIGS. 6 and 7. The phase error is reduced, as is the spatial resolution. By interpolation and scaling, the original phase error can be estimated, without risking wraps.

Alternatively, the preparation phase could include both readouts with a lower and with the original strength of the readout gradient GR. The readouts with the lower strength of the readout gradient would then primarily serve the disambiguation of the constant phase error, whereas assumptions required for the extrapolation of the phase error would not have to be made anymore.

Further, the signs of the constant phase error for echo 1 and echo 2 could be constrained. In general, the constant phase error is assumed to be lower in magnitude for echo 2 than for echo 1, due to partial cancellation of the effect of the B0 eddy currents. Taking the constant phase error for echo 2 as reference, the sign of the constant phase error for echo 1 could be enforced to be opposite, by adding or subtracting multiples of $2\pi$, if the magnitude of the constant phase error for echo 2 exceeds a given threshold.

Two preparatory pulses with gradients of opposite polarity may be used to estimate the linear phase error due to eddy currents and can improve in particular bipolar gradient dual-echo Dixon imaging. These same preparation or preparatory pulses, also referred to as the first and second modified pulse repetitions, can be used to correct for changes in the effective coil sensitivity due to measurements being taken asymmetrically with respect to the RF coil resonance.

In FIGS. 7 and 8, there is a linear region 700 where the phase difference can be deduced by subtracting the two. If the effective coil sensitivity for the first readout and the second readout (made in an opposite direction from the first) were the same, one would expect the amplitude for the two curves (not shown) to be the same. Examination of these amplitudes, however, reveals that they are different. This is because the RF coil and RF system have a frequency response that drops with distance from the resonant frequency. Measuring the ratio of the amplitudes can be used to properly scale the amplitude of the magnetic resonance data for the two gradient polarities.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS

| | |
|---|---|
| 100 | magnetic resonance system |
| 104 | magnet |
| 106 | bore of magnet |
| 108 | imaging zone |
| 110 | magnetic field gradient coils |
| 112 | magnetic field gradient coil power supply |
| 114 | radio-frequency coil |
| 116 | transceiver |
| 118 | subject |
| 120 | subject support |
| 122 | actuator |
| 126 | computer system |
| 128 | hardware interface |
| 130 | processor |
| 132 | user interface |
| 134 | computer storage |
| 136 | computer memory |
| 140 | pulse sequence commands |
| 142 | Dixon magnetic resonance data |
| 144 | first calibration magnetic resonance data |
| 146 | second calibration magnetic resonance data |
| 148 | first Fourier transformed data |
| 150 | second Fourier transformed data |
| 151 | predetermined factor |
| 152 | phase difference |

-continued

LIST OF REFERENCE NUMERALS

| | |
|---|---|
| 154 | corrected phase difference |
| 156 | corrected Dixon magnetic resonance data |
| 158 | water signal |
| 160 | fat signal |
| 170 | control module |
| 172 | image reconstruction module |
| 174 | water image |
| 176 | fat image |
| 200 | acquire the Dixon magnetic resonance data, the first calibration magnetic resonance data, and the second calibration magnetic resonance data by controlling the magnetic resonance imaging system with the pulse sequence commands |
| 202 | calculate first Fourier transformed data by Fourier transforming the first calibration magnetic resonance data in the readout direction |
| 204 | calculate second Fourier transformed data by Fourier transforming the second calibration magnetic resonance data in the readout direction |
| 206 | calculate a phase difference between the first and the second Fourier transformed data |
| 208 | calculate a corrected phase difference by interpolating and scaling the phase difference using the predefined factor |
| 210 | calculate a corrected Dixon magnetic resonance data using the Dixon magnetic resonance data, the predefined factor and the corrected phase difference |
| 212 | calculate a water signal and a fat signal from the corrected Dixon magnetic resonance data |
| 300 | timing diagram |
| 302 | preparatory phase |
| 304 | image phase |
| 306 | first modified pulse repetition |
| 308 | second modified pulse repetition |
| 310 | multiple pulse repetitions |
| 312 | readout gradient |
| 314 | phase encoding gradient |
| 316 | slice selection gradient |
| 318 | RF transmit/receive |
| 320 | Dixon readout gradient |
| 322 | sampling event |
| 324 | first modified readout gradient |
| 326 | sampling event |
| 328 | second modified readout gradient |
| 330 | sampling event |
| 402 | distance in readout direction |
| 404 | phase |
| 406 | discontinuity |
| 600 | timing diagram |
| 700 | linear region |

The invention claimed is:

1. A magnetic resonance imaging system for acquiring magnetic resonance data from an imaging zone, wherein the magnetic resonance imaging system comprises:
a processor for controlling the magnetic resonance imaging system;
a memory containing machine executable instructions and pulse sequence commands which cause the magnetic resonance imaging system to acquire the magnetic resonance data according to a Dixon magnetic resonance imaging method, wherein the pulse sequence commands cause the magnetic resonance imaging system to execute multiple pulse repetitions, wherein each of the multiple pulse repetitions causes the magnetic resonance imaging system to generate a Dixon readout gradient along a readout direction,
wherein each of the multiple pulse repetitions further causes the magnetic resonance imaging system to sample Dixon magnetic resonance data during the Dixon readout gradient, wherein the pulse sequence commands further cause the processor to perform one or more first modified pulse repetitions, wherein the pulse sequence commands further cause the processor to perform one or more second modified pulse repetitions, wherein each of the one or more first modified pulse repetitions causes the magnetic resonance imaging system to generate a first modified readout gradient, wherein the pulse sequence commands further cause the magnetic resonance imaging system to acquire first calibration magnetic resonance data during the first modified readout gradient during at least one of the one or more first modified pulse repetitions, wherein the first modified readout gradient is the Dixon readout gradient with an amplitude reduced by a predetermined factor, wherein each of the one or more second modified pulse repetitions causes the magnetic resonance imaging system to generate a second modified readout gradient, wherein the pulse sequence commands further cause the magnetic resonance imaging system to acquire second calibration magnetic resonance data during the second modified readout gradient during at least one of the one or more second modified pulse repetitions, wherein the second modified readout gradient is the Dixon readout gradient with an amplitude reduced by said or a different predetermined factor, wherein the first or the second modified readout gradient has a reversed polarity with respect to the Dixon readout gradient and the other modified readout gradient, wherein execution of the machine executable instructions cause the processor to:
acquire the Dixon magnetic resonance data, the first calibration magnetic resonance data, and the second calibration magnetic resonance data by controlling the magnetic resonance imaging system with the pulse sequence commands;
calculate first Fourier transformed data by Fourier transforming the first calibration magnetic resonance data in the readout direction;
calculate second Fourier transformed data by Fourier transforming the second calibration magnetic resonance data in the readout direction;
calculate a phase difference between the first Fourier transformed data and the second Fourier transformed data;
calculate a corrected phase difference by interpolating the phase difference along the Dixon readout gradient direction and by scaling the phase difference using the relevant predetermined factor;
calculate corrected Dixon magnetic resonance data from the Dixon magnetic resonance data and the corrected phase difference; and
calculate a water signal and a fat signal from the corrected Dixon magnetic resonance data.

2. The magnetic resonance imaging system of claim 1, wherein the predetermined factor is any one of the following: two ranges, between 1.8 and 2.2, and between 1.9 and 2.1.

3. The magnetic resonance imaging system of claim 1, wherein execution of the machine executable instructions further causes the processor to:
separately calculate constant components, linear components, and non-linear components of the phase of the first Fourier transformed data and the second Fourier transformed data,
modify the sign of one or more of the constant components, the linear components, and the non-linear components such that the constant components, the linear components, and the non-linear components have opposite signs for the first Fourier transformed data and the second Fourier transformed data before calculating the phase difference between the first Fourier transformed data and the second Fourier transformed data.

4. The magnetic resonance imaging system of claim 1, wherein the one or more first modified pulse repetitions are two or more first modified pulse repetitions, wherein each of the two or more first modified pulse repetitions has the first modified readout gradient reduced by a different predetermined factor chosen from a set of predetermined factors, wherein the predetermined factor is a member of the set of predetermined factors, wherein the one or more second modified pulse repetitions are two or more second modified pulse repetitions, wherein each of the two or more second modified pulse repetitions has the second modified readout gradient reduced by the different predetermined factor chosen from the set of predetermined factors, wherein execution of the machine executable instructions further causes the processor to:
calculate a phase difference between the first Fourier transformed data and the second Fourier transformed data for each member of the set of predetermined factors;
find a smallest member of the set of predetermined factors that does not result in the detection of a potential phase wrapping in the phase difference; and
calculate the corrected phase difference at least partially by resolving phase wrapping in the first Fourier transformed data and the second Fourier transformed data and/or in the phase difference, for each member of the set of predetermined factors that is smaller than the smallest member.

5. The magnetic resonance imaging system of claim 1, wherein the one or more first modified pulse repetitions is multiple first modified pulse repetitions, wherein the multiple first modified pulse repetitions comprise a last performed first modified pulse repetition, and wherein the first calibration magnetic resonance data is acquired during the last performed first modified pulse repetition.

6. The magnetic resonance imaging system of claim 1, wherein the one or more second modified pulse repetitions is multiple second modified pulse repetitions, wherein the multiple second modified pulse repetitions comprise a last performed second modified pulse repetition, and wherein the second calibration magnetic resonance data is acquired during the last performed second modified pulse repetition.

7. The magnetic resonance imaging system of claim 1, wherein execution of the machine executable instructions further causes the processor to:
detect a potential phase wrapping in the phase difference between the first and the second Fourier transformed data;
increase the predetermined factor if a potential phase wrapping is detected;
reacquire the first calibration magnetic resonance data and the second calibration magnetic resonance data by controlling the magnetic resonance imaging system with the pulse sequence commands after increasing the predetermined factor;
recalculate the first Fourier transformed data by Fourier transforming the first calibration magnetic resonance data in the readout direction after reacquiring the first calibration magnetic resonance data; and
recalculate the second Fourier transformed data by Fourier transforming the second calibration magnetic resonance data in the readout direction after reacquiring the second calibration magnetic resonance data.

8. The magnetic resonance imaging system of claim 1, wherein the readout gradient is a bipolar multi-echo readout gradient.

9. The magnetic resonance imaging system of claim 1, wherein the readout gradient is a bipolar dual-echo readout gradient.

10. The magnetic resonance imaging system of claim 8, wherein execution of the machine executable instructions further cause the processor to:
determine a first amplitude of the first Fourier transformed data;
determine a second amplitude of the second Fourier transformed data; and
calculate a ratio of a first effective coil sensitivity for readout gradients of a first polarity to a second effective coil sensitivity for readout gradients of a second polarity, wherein the first polarity is opposite to the second polarity, wherein the ratio is positive, wherein the calculation of the corrected Dixon magnetic resonance data comprises interpolating and scaling this ratio using the predefined factor and applying it to the amplitude of the Dixon magnetic resonance data.

11. The magnetic resonance imaging system of claim 1, wherein the readout gradient is a unipolar readout gradient or a flyback readout gradient.

12. A computer program product for execution by a processor controlling a magnetic resonance imaging system for acquiring magnetic resonance data from an imaging zone, wherein execution of the instructions causes the processor to:
acquire Dixon magnetic resonance data, first calibration magnetic resonance data, and second calibration magnetic resonance data by controlling the magnetic resonance imaging system with pulse sequence commands, wherein the pulse sequence commands cause the magnetic resonance imaging system to acquire Dixon magnetic resonance data according to a Dixon magnetic resonance imaging method, wherein the pulse sequence commands cause the magnetic resonance imaging system to execute multiple pulse repetitions, wherein each of the multiple pulse repetitions causes the magnetic resonance imaging system to generate a Dixon readout gradient along a readout direction, wherein each of the multiple pulse repetitions further causes the magnetic resonance imaging system to sample the Dixon magnetic resonance data during the Dixon readout gradient, wherein the pulse sequence commands further cause the processor to perform one or more first modified pulse repetitions, wherein the pulse sequence commands further cause the processor to perform one or more second modified pulse repetitions (308), wherein each of the one or more first modified pulse repetitions causes the magnetic resonance imaging system to generate a first modified readout gradient, wherein the pulse sequence commands further cause the magnetic resonance imaging system to acquire first calibration magnetic resonance data during the first modified readout gradient during at least one of the one or more first modified pulse repetitions, wherein the first modified readout gradient is the Dixon readout gradient with an amplitude reduced by a predetermined factor, wherein each of the one or more second modified pulse repetitions causes the magnetic resonance imaging system to generate a second modified readout gradient, wherein the pulse sequence commands further cause the magnetic resonance imaging system to acquire second calibration magnetic resonance data during the second modified readout gradient during at least one of the one or more second modified pulse repetitions, wherein the second modified readout gradient is the Dixon readout gradient with an amplitude reduced by said or a different predetermined factor, wherein the first or the second modified readout gradient has a reversed polarity with respect to the Dixon readout gradient and the other modified readout gradient;
calculate first Fourier transformed data by Fourier transforming the first calibration magnetic resonance data in the readout direction;
calculate second Fourier transformed data by Fourier transforming the second calibration magnetic resonance data in the readout direction;
calculate a phase difference between the first and the second Fourier transformed data;
calculate a corrected phase difference by interpolating the phase difference along the Dixon readout gradient direction and by scaling using relevant predetermined factor;
calculate corrected Dixon magnetic resonance data from the Dixon magnetic resonance data and the corrected phase difference; and
calculate a water signal and a fat signal from the corrected Dixon magnetic resonance data.

13. A method of controlling a magnetic resonance imaging system to acquire magnetic resonance data from an imaging zone, wherein the method comprises the steps of:
acquiring Dixon magnetic resonance data, first calibration magnetic resonance data, and second calibration magnetic resonance data by controlling the magnetic resonance imaging system with pulse sequence commands, wherein the pulse sequence commands cause the magnetic resonance imaging system to acquire the magnetic resonance data according to a Dixon magnetic resonance imaging method, wherein the pulse sequence commands cause the magnetic resonance imaging system to execute multiple pulse repetitions, wherein each of the multiple pulse repetitions causes the magnetic resonance imaging system to generate a Dixon readout gradient along a readout direction, wherein each of the multiple pulse repetitions further causes the magnetic resonance imaging system to sample the Dixon magnetic resonance data during the Dixon readout gradient, wherein the pulse sequence commands further cause the processor to perform one or more first modified pulse repetitions, wherein the pulse sequence commands further cause the processor to perform one or more second modified pulse repetitions, wherein each of the one or more first modified pulse repetitions causes the magnetic resonance imaging system to generate a first modified readout gradient, wherein the pulse sequence commands further cause the magnetic resonance imaging system to acquire first calibration magnetic resonance data during the first modified readout gradient during at least one of the one or more first modified pulse repetitions, wherein the first modified readout gradient is the Dixon readout gradient with an amplitude reduced by a predetermined factor, wherein each of the one or more second modified pulse repetitions causes the magnetic resonance imaging system to generate a second modified readout gradient, wherein the pulse sequence commands further cause the magnetic resonance imaging system to acquire second calibration magnetic resonance data during the second modified readout gradient during at least one of the one or more second modified pulse repetitions, wherein the second modified readout gradient is the Dixon readout gradient with an amplitude reduced by said or a different predetermined factor, wherein the first or the second modified readout gradient has a reversed polarity with respect to the Dixon readout gradient and the other modified readout gradient;

calculating first Fourier transformed data by Fourier transforming the first calibration magnetic resonance data in the readout direction;

calculating second Fourier transformed data by Fourier transforming the second calibration magnetic resonance data in the readout direction;

calculating a phase difference between the first and the second Fourier transformed data;

calculating a corrected phase difference by interpolating the phase difference along the Dixon readout gradient direction and by scaling the phase difference using relevant predetermined factor;

calculating corrected Dixon magnetic resonance data from the Dixon magnetic resonance data and the corrected phase difference; and calculating a water signal and a fat signal from the corrected Dixon magnetic resonance data.

* * * * *